(12) United States Patent
Shimada et al.

(10) Patent No.: US 6,740,171 B2
(45) Date of Patent: May 25, 2004

(54) MANUFACTURING METHOD OF SEMICONDUCTOR INTEGRATED CIRCUIT DEVICE

(75) Inventors: Yutaka Shimada, Chiyoda (JP); Yasuhiro Mori, Hitachinaka (JP); Koyo Morita, Tachikawa (JP); Kenji Yokoshima, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/083,402

(22) Filed: Feb. 27, 2002

(65) Prior Publication Data

US 2003/0041878 A1 Mar. 6, 2003

(30) Foreign Application Priority Data

Aug. 29, 2001 (JP) .......................................... 2001-259111

(51) Int. Cl.[7] .............................. B08B 1/04; B08B 3/04
(52) U.S. Cl. ............................. 134/6; 134/18; 134/32; 134/33
(58) Field of Search ..................... 134/6, 18, 32, 134/33

(56) References Cited

U.S. PATENT DOCUMENTS 5,858,112 A * 1/1999 Yonemizu et al. ............. 134/6
6,059,891 A * 5/2000 Kubota et al. ................ 134/18
6,167,583 B1 * 1/2001 Miyashita et al. ............ 15/77

FOREIGN PATENT DOCUMENTS

| JP | 7-74134 | 3/1995 |
| JP | 7-321082 | 12/1995 |
| JP | 10-223596 | 8/1998 |
| JP | 10-223597 | 8/1998 |
| JP | 10-294302 | 11/1998 |
| JP | 10-335281 | 12/1998 |
| JP | 11-57632 | 3/1999 |
| JP | 11-207271 | 8/1999 |
| JP | 2000-208462 | 7/2000 |
| JP | 2000-263417 | 9/2000 |

* cited by examiner

*Primary Examiner*—Zeinab El-Arini
(74) *Attorney, Agent, or Firm*—Miles & Stockbridge P.C.

(57) ABSTRACT

A foreign-matter removal capacity is improved in a cleaning process. When a wafer is cleaned while a brush is moved from the center of the wafer toward the outer circumference thereof, a discharge flow rate of cleaning liquid flowing into the brush is regulated so that the interval between the brush and the wafer is kept constant.

31 Claims, 16 Drawing Sheets

MANUFACTURING METHOD OF SEMICONDUCTOR INTEGRATED CIRCUIT DEVICE

BACKGROUND OF THE INVENTION

The present invention relates to an manufacturing technique of a semiconductor integrated circuit device, and particularly to a technique effectively applied to a wafer cleaning technique.

For example, a scrubbing equipment provided with a brush-pressing control mechanism is a single-wafer-cleaning equipment that has a brush for scrubbing a wafer and a mechanism for pressing the above-mentioned brush against a rotating wafer at a constant pressure. There are some brush-pressing control mechanisms each of which controls a load to be applied to a brush by, for example, controlling the air pressure in an air cylinder connected with a brush holding section.

Moreover, a scrubbing equipment provided with a mechanism for discharging demineralized water from a brush is a single-wafer-cleaning equipment for cleaning a wafer by setting a demineralized-water nozzle to the inside and outside of a brush for scrubbing the wafer while discharging a constant quantity of demineralized water from the demineralized-water nozzle. To discharge the constant quantity of demineralized water, a mechanism is used which controls a demineralized-water flow rate by a flow meter connected to a pipe of the demineralized water flowing into the brush.

Moreover, there is a system for brush-cleaning the surface of a wafer while discharging chemical liquid on a wafer. This system uses a mechanism for removing foreign matters from a wafer by discharging the chemical liquid and thereby lowering the zeta potential of the foreign matters adhering onto the wafer.

Furthermore, there is a system for performing cleaning while supplying hydrogen peroxide or the like in order to remove particles transferred to a brush made of PVA.

A cleaning technique is disclosed in, for example, Japanese Patent Laid-Open No. 10-223596 which discloses a substrate-cleaning equipment having a height-position control means for lowering a cleaning tool at the time of detecting that a height position of the cleaning tool from a cleaning face is higher than a reference height in order to prevent a cleaning trouble or rebound phenomenon due to the surface-height fluctuation or the like of a wafer substrate.

Moreover, for example, Japanese Patent Laid-Open No. 10-223597 discloses that there is a problem that fluctuation occurs in cleaning because the rotational speed of a wafer differs in the central portion and circumferential portion of the wafer, and that a means for solving such the problem is a method for cleaning a substrate by monitoring the position of a cleaning face of a cleaning tool and changing pressures or rotational speeds of the cleaning tool correspondingly to the position.

Furthermore, for example, Japanese Patent Laid-Open No. 11-57632 discloses a substrate-cleaning equipment for making cleaning constant by detecting a rotary-arm position and changing rotational speeds of the rotating arm, those of a cleaning brush, or those of a spin chuck in accordance with the rotary-arm position because cleaning fluctuation occurs nearby the center and circumferential edge of a wafer.

Furthermore, for example, Japanese Patent Laid-Open No. 7-321082 discloses a brush cleaning technique having a step of simultaneously blowing cleaning liquid and gas on a rotating substrate.

Furthermore, for example, Japanese Patent Laid-Open No. 11-207271 discloses a technique for performing cleaning while hydrogen peroxide is supplied in order to remove particles transferred to a cleaning brush made of PVA.

Furthermore, for example, Japanese Patent Laid-Open No. 2000-208462 discloses a brush-conditioning technique for cleaning a cylindrical cleaning brush made of PVA, by chemicals superior to water in solubility, in order to remove dirt of the brush.

Furthermore, for example, Japanese Patent Laid-Open No. 10-294302 discloses a technique for removing floated foreign matters by rotating a cleaning brush while chemical liquid is discharged from a nozzle provided at the brush in order to effectively perform scrub.

Furthermore, for example, Japanese Patent Laid-Open No. 2000-263417 discloses a polishing technique designed so that a brush set to a dresser for removing polishing wastes passes through a position separate from the surface of a polishing surface plate and the brush is cleaned in a brush cleaning bath located on the separate position.

Furthermore, for example, Japanese Patent Laid-Open No. 10-335281 discloses a cleaning art for cleaning a brush made of PVA, by separating a wafer from the brush while cleaning liquid flows and the wafer and the brush is rotated under wafer cleaning, and thereby removing foreign matters adhering to the wafer and the brush by a centrifugal force, and temporarily cleaning the wafer and the brush, and then bringing the brush into contact with the wafer and cleaning the brush again.

Furthermore, for example, Japanese Patent Laid-Open No. 7-74134 discloses a technique for cleaning a substrate by raising a cleaning brush in a direction separate from the substrate, moving the brush to the center of the substrate, and lowering the brush while the cleaning brush is rotated without taking, in the center of the substrate, the particles having been once removed from the substrate.

SUMMARY OF THE INVENTION

The present inventors, however, have found that the above cleaning techniques have the following problems.

The first is the problem that a difference in cleaning capacity (foreign-matter removal rate) is present between the center and the circumference of a wafer. Brush cleaning is a method of forming a wafer film on a wafer while rotating the wafer, cleaning the wafer while floating the brush, the method in which the distance between the wafer and the brush greatly depends on the foreign-matter removal capacity. When the interval between the wafer and the brush is large, the foreign-matter removal capacity is deteriorated when the wafer contacts with the brush, the wafer is damaged due to transfer or the like of foreign matters from the brush. Therefore, it is necessary to keep the interval between the wafer and the brush uniform in a wafer face and keep an optimum value. However, in the case of keeping a brush pressure constant, buoyancy of the brush becomes small nearby the center of the wafer whose the peripheral velocity is small, and the brush contacts the wafer, and the wafer is damaged. To the contrary, because the buoyancy of the brush becomes large nearby the outer circumference of the wafer, the interval between the wafer and the brush increases and the foreign-matter removal capacity is deteriorated.

Moreover, in the case of keeping constant the demineralized-water flow rate from the brush, if dropping onto the wafer, the brush contacts with the wafer due to an impact of the drop and the wafer is damaged due to transfer or the like of foreign matters from the brush. To the contrary, when the demineralized-water flow rate is controlled so that the wafer is not damaged, the interval between the wafer and the brush becomes large because the water film becomes thick at the central portion of the wafer, and thereby the foreign-matter removal capacity is deteriorated.

The second is a problem due to foreign matters adhering to a brush. Because foreign matters adhere to a brush itself or the brush itself is filled with the foreign matters as brush cleaning is repeated, the foreign matters adhere onto the brush may transfer to a wafer during a cleaning process. However, when, in such a state as adhesion of the foreign matters to the wafer, the brush is brought into contact with the wafer to clean the wafer, the wafer is damaged.

An object of the present invention is to provide a technique capable of improving the foreign-matter removal capacity of a cleaning process.

Another object of the present invention is to provide a technique capable of reducing or preventing damage to a substrate during cleaning of a substrate such as a wafer or the like.

The above and other objects and novel features of the present invention will become more apparent from the description of the specification and the accompanying drawings.

The outline of a typical invention among the inventions disclosed in this application will be briefly described below.

That is, the present invention makes it possible to keep the interval between a substrate such as a wafer or the like and a brush at a constant value by regulating a cleaning condition in accordance with a cleaning state when the substrate is cleaned by a cleaning process using the brush.

DETAILED DESCRIPTION OF THE PREFERRED EMBODIMENTS

The following embodiments are described by dividing them into a plurality of sections or sub-embodiments according to necessity. However, unless otherwise specified, they are related to each other in which one of them serves as a modification, detail, or supplementary note of a part or the whole of the other.

Moreover, when referring to the number of factors (including the number of pieces, numerical values, quantities, and ranges) in the following embodiments, the number of factors is not restricted to the specified number but it may be equal to or more or less than the specified number unless otherwise specified or except the case where the number of factors is clearly restricted to a specified number in principle.

Furthermore, it is needless to say that components (including factor steps) of the following embodiments are not necessarily indispensable unless otherwise specified or except the case where the components are clearly considered to be indispensable in principle. It is similar to the above numerical values and ranges.

Furthermore, when referring to shapes or positional relations of components of the following embodiments, the components substantially approximate to or similar to the shapes are included unless otherwise specified or except the case where the shapes or positional relations are clearly considered to be excluded in principle. The same can be applied to the above numerical value and range.

Furthermore, components having the same function are provided with the same symbol in all drawings for explaining these embodiments and repetitive description thereof will be omitted.

Furthermore, in the case of the drawings used in these embodiments, even a plan view may be hatched in order to make the plan view easily visible.

Furthermore, in the case of these embodiments, a MIS-.FET (Metal Insulator Semiconductor Field Effect Transistor) is abbreviated as MIS, a p-channel MIS.FET is abbreviated as pMIS, and n-channel MIS.FET is abbreviated as nMIS.

Furthermore, it is assumed that the flow rate of cleaning water to be supplied into a brush is equal to that of cleaning water to be discharged from the brush to the outside.

These embodiments of the present invention will be described below in detail by referring to the accompanying drawings.

Embodiment 1

Figure 1:
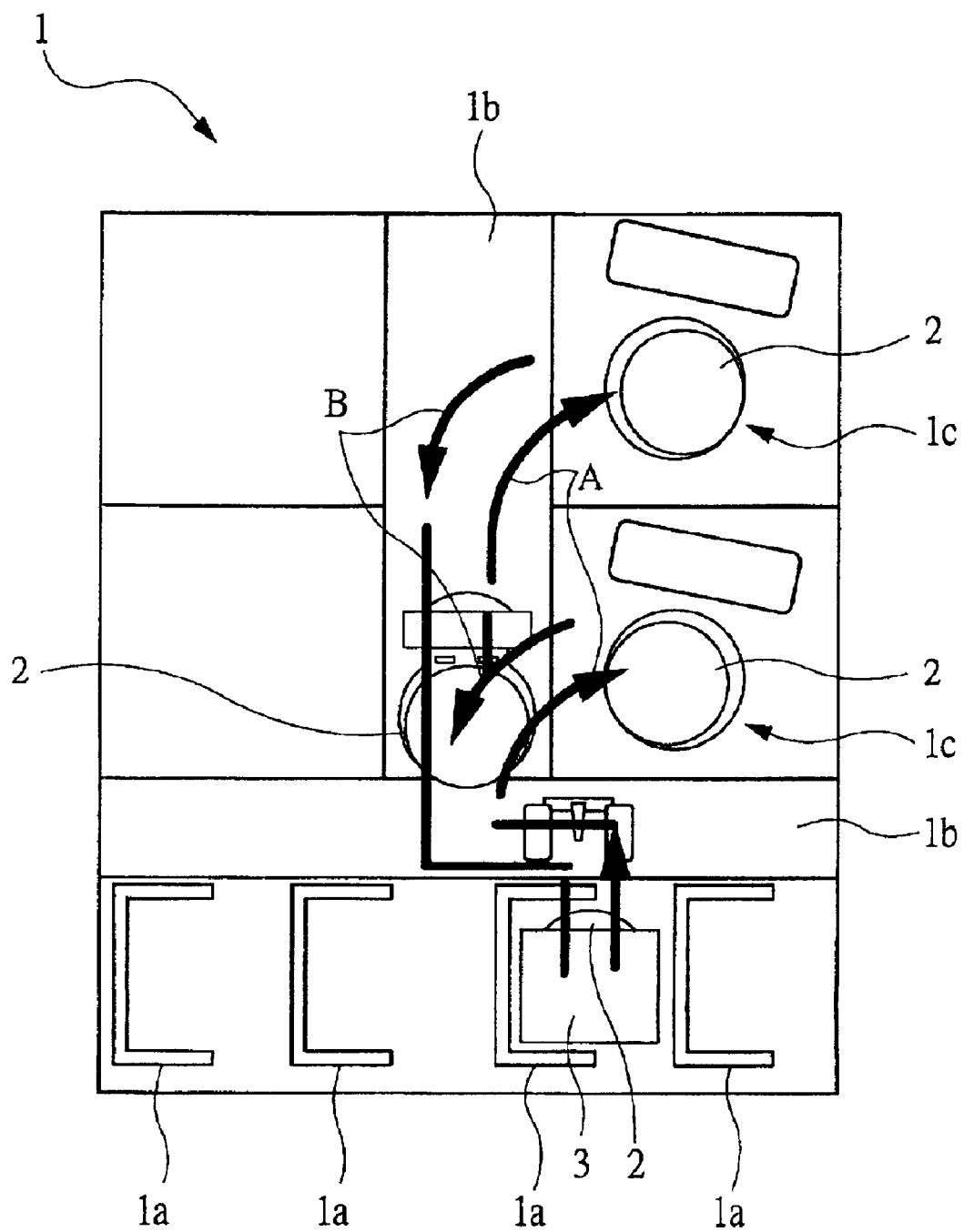
FIG. 1 is a plan view showing an example of a brush-cleaning equipment used in the manufacturing process of a semiconductor integrated circuit device that is an embodiment of the present invention.

FIG. 1 is a plan view showing an example of a brush-cleaning equipment 1 used in the manufacturing process of a semiconductor integrated circuit device which is an embodiment of the present invention.

The brush-cleaning equipment 1 is a single-wafer-cleaning equipment having a loader 1a, a carrying path 1b, and a plurality of cups 1c. The loader 1a is a mechanical section for carrying wafers 2 into or out of the brush-cleaning equipment 1. Carrying-in/out of the wafers 2 is performed per wafer cassette 3. A plurality of wafers 2 are accommodated in one wafer cassette 3.

When the wafer cassette 3 is carried into the loader 1a, plural wafers are taken out of the wafer cassette 3 one by one, carried to cups 1c by the carrying mechanism (such as carrying arm or the like) of the carrying path 1b, and cleaned and dried one by one (arrow A). Moreover, the wafers 2 having been cleaned and dried in the cups 1c are carried to the loader 1a by the carrying mechanism of the carrying path 1b one by one and housed in the wafer cassette 3 (arrow B).

Figure 2:
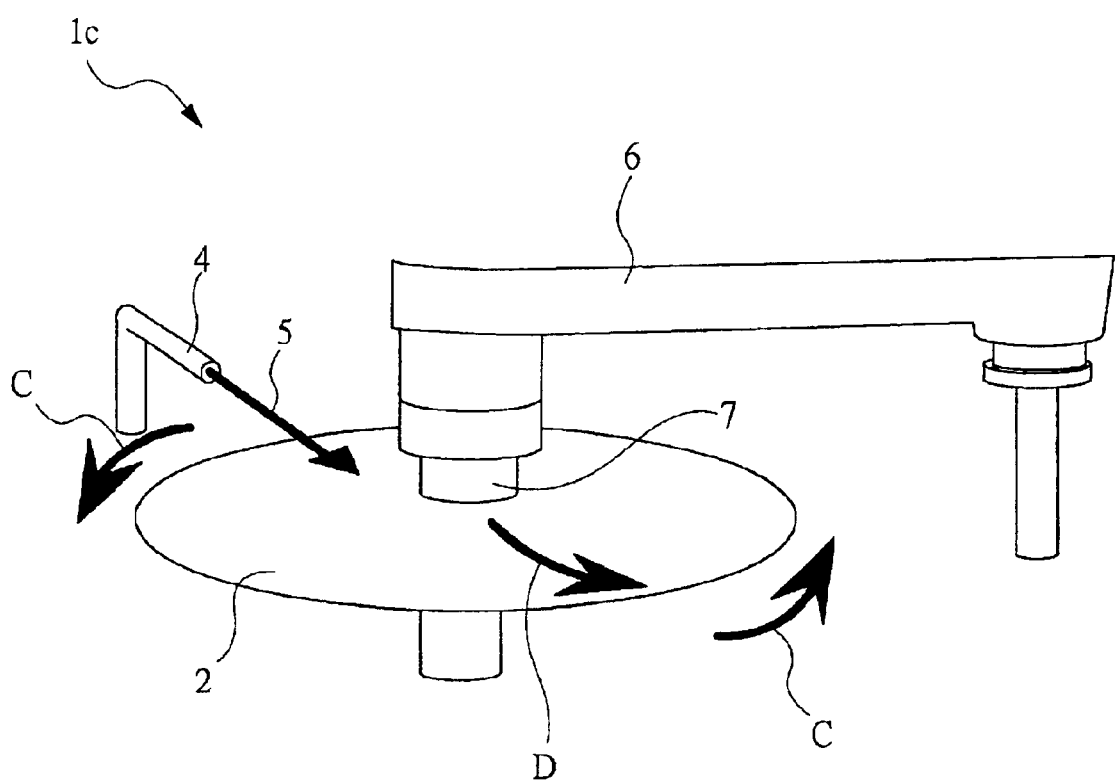
FIG. 2 is a perspective view showing an example of a cup of the brush-cleaning equipment in FIG. 1.

FIG. 2 is a perspective view showing an example of a cup 1c of the brush-cleaning equipment 1 in FIG. 1. In the cup 1c, cleaning liquid such as demineralized water 5 or the like is discharged from a side rinse section 4 while the wafer 2 (in a direction of arrow C in FIG. 2; counterclockwise) is rotated, and poured on the surface of the wafer 2. When a brush-cleaning arm 6 reaches an optional position on the surface of the wafer 2, a brush 7 is lowered onto the surface of the wafer 2. After the brush 7 has contacted with the wafer 2, the brush 7 cleans the surface of the wafer 2 while moving toward the outer circumference of the wafer 2 as shown by the arrow D.

Figure 3:
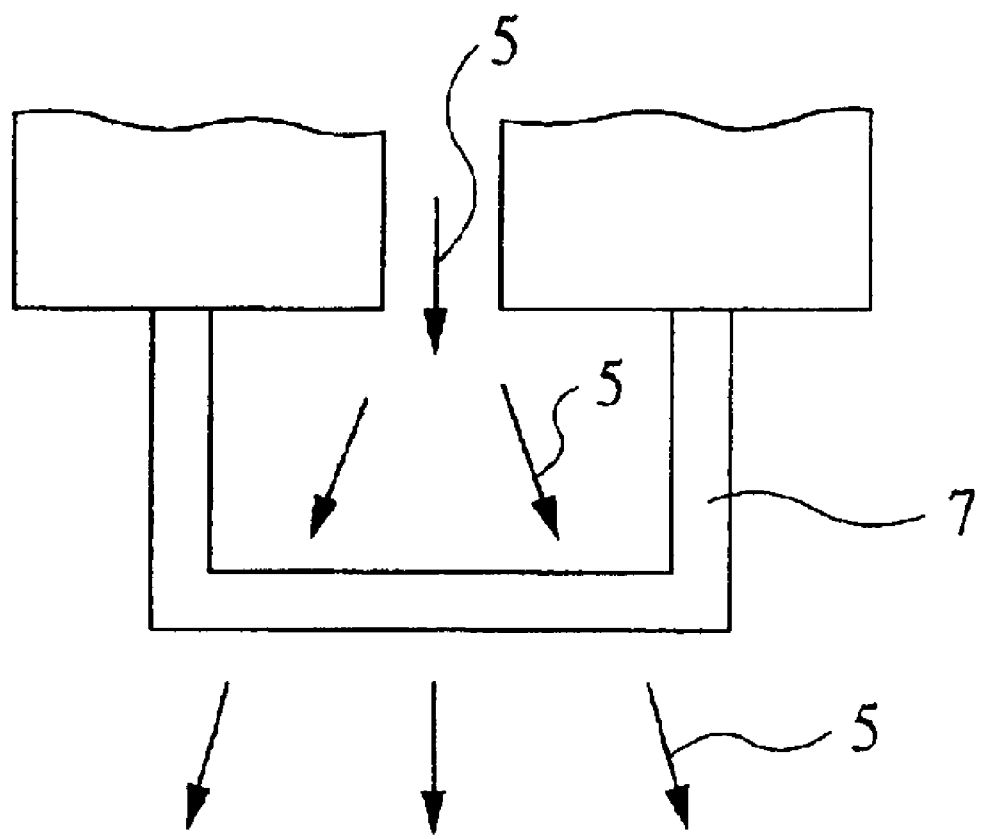
FIG. 3 is an explanatory view of a structure for discharging cleaning liquid into a brush.

FIG. 3 is an explanatory view showing a structure for discharging demineralized water into the brush. This structure makes it possible to supply cleaning liquid such as the demineralized water or the like 5 into the brush 7 and discharge the liquid from the inside of the brush 7 to the outside.

Figure 4:
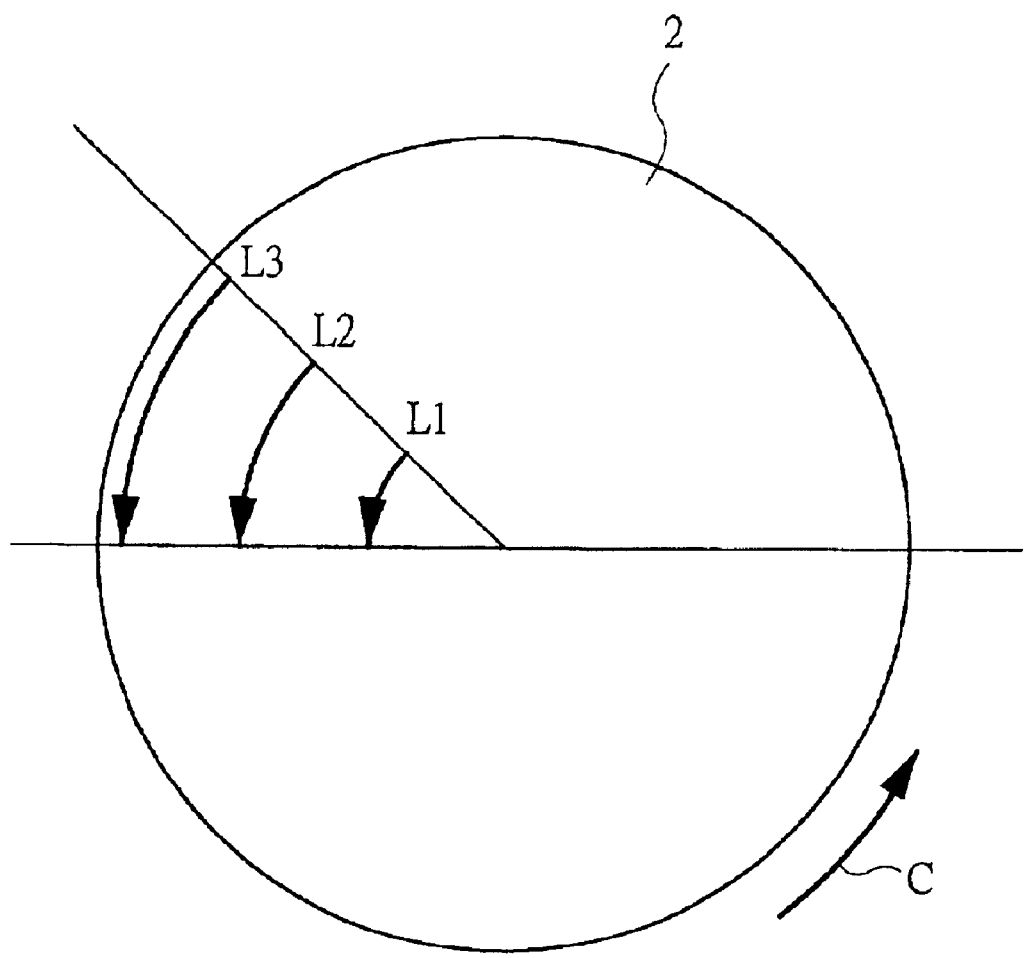
FIG. 4 is an explanatory view showing the relation between rotation and peripheral velocity of a wafer.

FIG. 4 shows the relation between rotation and peripheral velocity of the wafer 2. In the case where the wafer 2 rotates at constant revolutions, the peripheral velocity differs in the central portion and the circumferential portion of the wafer 2. The relation between the peripheral velocities shows L3>L2>L1 when the velocities based on lines L1 to L3 in FIG. 4 are compared to one another.

Figure 5:
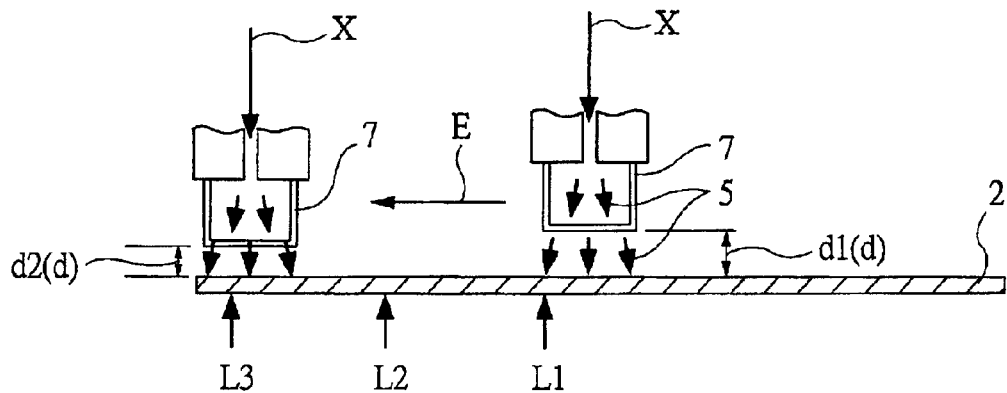
FIG. 5 is an explanatory view showing changes in the interval between a brush and a wafer in the case where the discharge flow rate of cleaning liquid discharged into the brush is kept constant.

FIG. 5 shows the clearance d between the brush 7 and the wafer 2 when the discharge flow rate X of cleaning liquid such as the demineralized water 5 or the like discharged from the brush 7 is constant. In the case where the wafer 2 rotates under the state shown in FIG. 4 and the discharge flow rate X of the demineralized water 5 or the like discharged from the brush 7 is constant, as the brush 7 moves in the direction shown by arrow E in FIG. 5 (a direction approaching to the outer circumference of the wafer 2), clearances d1 and d2 between the brush 7 and the wafer 2 are changed due to a peripheral velocity and comes to the relation of d1>d2. That is, the clearance d becomes small at a high peripheral velocity and becomes large at a low peripheral velocity. Lengths of arrows of the discharge flow rates X at respective positions of the brush 7 on the main surface of the wafer 2 visually show that each of the discharge flow rates is equal.

Figure 6:
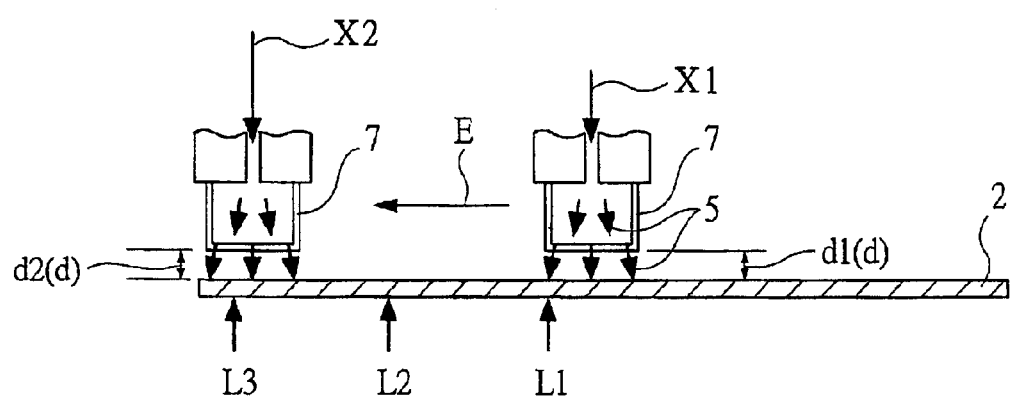
FIG. 6 is an explanatory view showing changes in the interval between a brush and a wafer when discharge flow rate of cleaning liquid discharged into a brush is changed.

FIG. 6 shows the clearance d between the brush 7 and the wafer 2 when discharge quantities of the demineralized water 5 or the like discharged from the brush 7 are changed. In the case of this embodiment 1, it is possible to uniformly keep the clearance d between the wafer 2 and the brush 7, by changing the discharge flow rates X1 and X2 of the demineralized water 5 or the like supplied into the brush 7 in accordance with time and state (a planar position or a peripheral velocity or the like of the brush). Specifically, as the brush 7 moves in the direction of arrow E (a direction approaching to the outer circumference of the wafer 2), that is, as the peripheral velocity rises, the discharge flow rate X of the demineralized water 5 in the brush 7 is increased. Lengths of the arrows of the discharge flow rates X1 and X2 visually show magnitudes of discharge flow rates.

Figure 7:
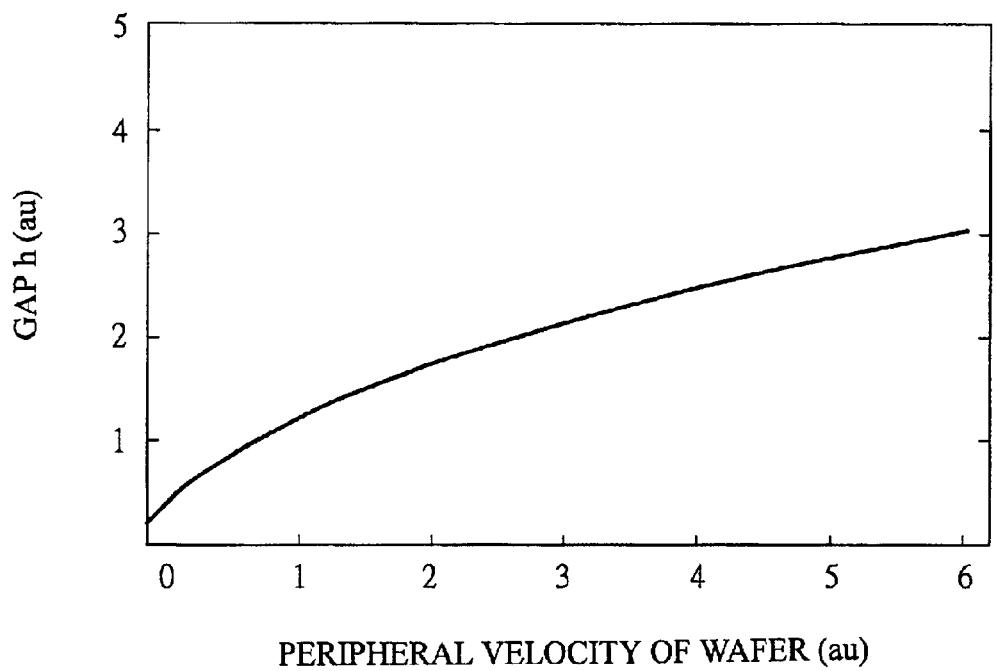
FIG. 7 is a graph showing the relation between the relative velocity in a wafer surface and the interval (gap) between the main surface of a wafer and a brush.

Meanwhile, a difference occurs between magnitudes of the buoyancy to the brush 7 due to the peripheral velocity in the wafer 2. That is, the magnitudes of the buoyancy increase as the brush 7 moves from the center of the wafer 2 to the outer circumference. FIG. 7 shows that the clearance (gap) between the brush 7 and the wafer 2 increases as a relative velocity rises. Therefore, when the flow rate of cleaning liquid (side rinse) to be supplied to the wafer 2 from the outside of the wafer 2 different from the brush 7 is constant, contrary to the above description, the clearance between the brush 7 and the wafer 2 at the outer circumferential portion of the wafer becomes larger than the clearance between the brush 7 and the wafer 2 at the central portion of the wafer.

Figure 8:
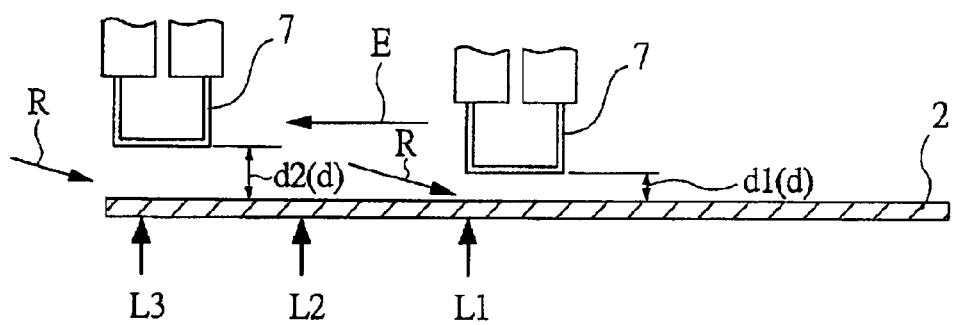
FIG. 8 is an explanatory view showing changes in the intervals between a brush and a wafer in the case where the discharge flow rate of side rinse is kept constant.

FIG. 8 shows the clearance d between the brush 7 and the wafer 2 when the discharge flow rate R of side rinse is constant. In the case where the wafer 2 rotates under the state shown in FIG. 4 and the discharge flow rate R of the side rinse is constant, as the brush 7 moves in the direction shown by arrow E in FIG. 5 (a direction approaching to the outer circumference of the wafer 2), the clearances d1 and d2 between the brush 7 and the wafer 2 are changed due to a peripheral velocity and comes to the relation of d2>d1 in this case. That is, the clearance d becomes large at a high peripheral velocity and becomes small at a low peripheral velocity. Lengths of arrows of the discharge flow rates R at respective positions of the brush 7 on the main surface of the wafer 2 visually show that each of the discharge flow rates are equal.

Figure 9:
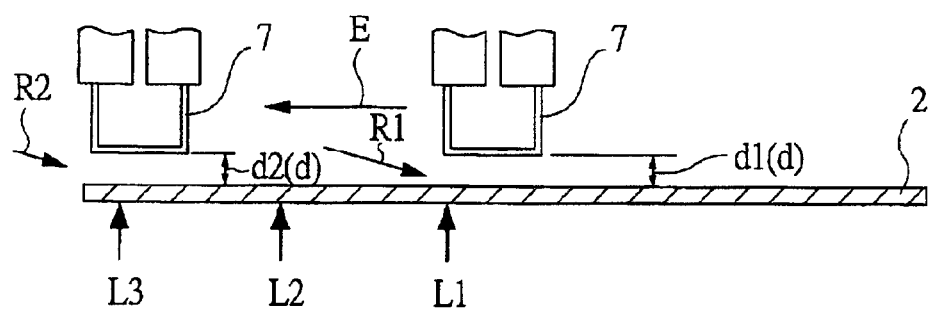
FIG. 9 is an explanatory view showing changes in the intervals between a brush and a wafer when discharge flow rate of side rinse is changed.

FIG. 9 shows the clearance d between the brush 7 and the wafer 2 when discharge quantities of side rinse are changed.

In the case of this embodiment 1 are changed, it is possible to uniformly keep the clearance d between the wafer 2 and the brush 7 by changing the discharge flow rates R1 and R2 of the side rinse in accordance with time and state (a planar position or a peripheral velocity or the like of the brush). Specifically, as the brush 7 moves in the direction of arrow E (a direction approaching to the outer circumference of the wafer 2), that is, as the peripheral velocity increases, the discharge flow rate R of the side rinse is decreased. Lengths of arrows of the discharge flow rates R1 and R2 visually show magnitudes of discharge flow rates.

Thus, by regulating at least one of the discharge flow rate of cleaning liquid discharged from the brush 7 and the discharge flow rate of the above-mentioned side rinse, cleaning is performed while the clearance d between the wafer 2 and the brush 7 is kept constant. Thereby, it is possible to improve a foreign-matter removal capacity by preventing the brush 7 from extremely separating therefrom at the outer circumference of the wafer 2 while the occurrence of damage to the wafer 2, due to contact of the brush 7 at the center of the wafer 2, is suppressed or prevented. Moreover, by keeping the interval d between the wafer 2 and the brush 7 constant, it is possible to keep the thickness of a wafer film between the wafer 2 and the brush 7 constant, and so to make the foreign-matter removal capacity in the cleaning face of the wafer 2 uniform. Therefore, it is possible to eliminate the deviation of a defective chip due to foreign matters and improve the yield of semiconductor integrated circuit devices. Particularly, the diameter of a wafer tends to be increased up to about 300 mm and thereby the difference between peripheral velocities at the center and the outer circumference of the wafer increases. Therefore, the fluctuation in clearances between the brush 7 and the wafer 2 as described above becomes a large problem. However, by using the technique of this embodiment 1, it is possible to avoid the above problem. Therefore, it is possible to perform preferable cleaning process and obtain a plurality of good semiconductor chips from a large-diameter wafer as purposed. For the above embodiment, the case has been described where at least one of the discharge flow rates of the cleaning liquid and the side rinse from the brush 7 is regulated. However, in the case of comparing the both discharge flow rates, controlling the discharge quantities of the cleaning liquid discharged from the brush 7 is more advantageous to obtainment of the above-mentioned effect. Of course, it is also advantageous by only regulating the discharge flow rate of the side rinse. Moreover, it is the most preferable to regulate both of the discharge flow rates of the cleaning liquid and the side rinse discharged from the brush 7.

Figure 10:
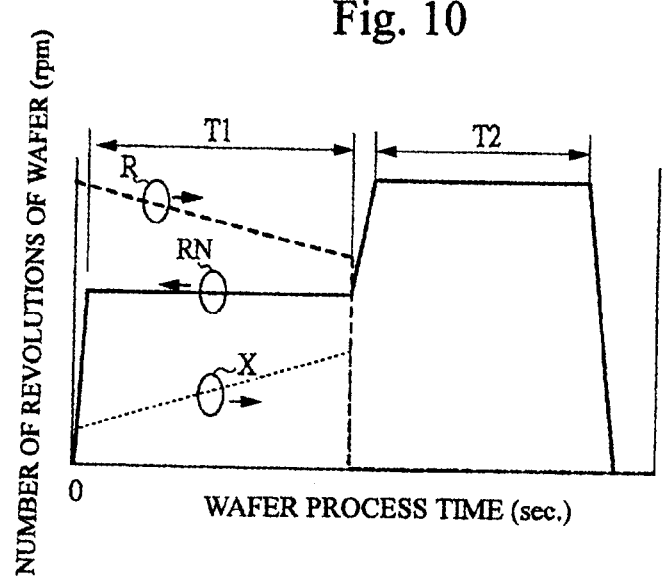
FIG. 10 is an illustration showing a sequence of a brush cleaning process when discharge flow rate of cleaning liquid flowing into a brush is changed in the manufacturing process of a semiconductor integrated circuit device which is another embodiment of the present invention.

FIG. 10 shows an example of a brush cleaning sequence when the discharge flow rate X of the cleaning liquid (demineralized water 5 or the like) discharged from the brush 7 and the discharge flow rate R of the side rinse are changed. Symbol RN denotes change in the number of revolutions of the wafer, symbol T1 denotes a brush cleaning time, symbol T2 denotes a shake-off drying time, and broken lines denote changes in the discharge flow rate X of the cleaning liquid discharged from the brush 7 and the flow rate R of the above-mentioned side rinse, respectively. The diameter of the wafer 2 used in the above case is about 200 mm.

The brush 7 moves from the center of the wafer 2 toward the outer circumference within the brush cleaning time T1. In this case, while the number of revolutions of the wafer is kept constant, the discharge flow rate X of the cleaning liquid such as demineralized water or the like in the brush 7 and the discharge flow rate R of side rinse are changed as following the movement of the brush 7. In this case, the discharge flow rate X of the cleaning liquid discharged from the brush 7 is slowly increased. To the contrary, the discharge flow rate R of the side rinse is slowly decreased. When the sequence reaches the shake-off drying time T2, the discharge flow rate X of the demineralized water 5 or the like in the brush 7 and the discharge flow rate R of the side rinse are set to be zero (0). That is, supply of both of the cleaning liquids is stopped. The brush cleaning time T1 is, for example, about 10 seconds. The number of revolutions of the wafer in the brush cleaning time T1 is, for example, about 3,000 rpm. Moreover, the shake-off drying time T2 is, for example, about 20 seconds. The number of revolutions of the wafer 2 in the shake-off drying time T2 is, for example, about 5,000 rpm. The moving velocity of the brush 7 is, for example, about 10 mm/sec.

Figure 11:
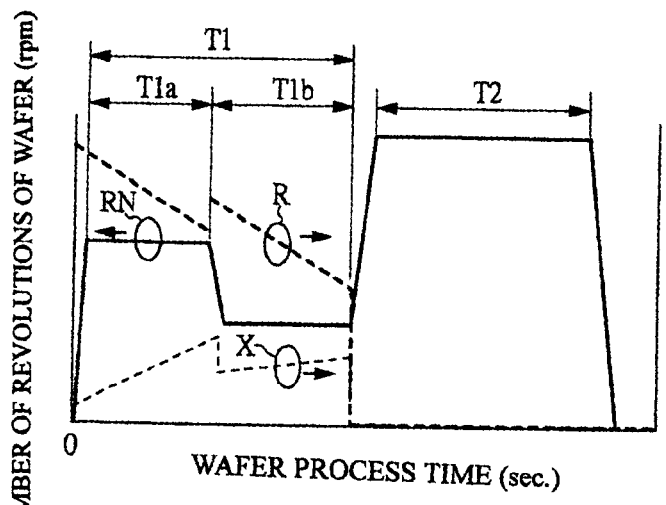
FIG. 11 is an illustration showing a sequence of a brush cleaning process in the manufacturing process of a semiconductor integrated circuit device which is still another embodiment of the present invention.

FIG. 11 shows a modification of the brush cleaning sequence. That is, FIG. 11 shows a brush cleaning sequence when the discharge flow rate X of the cleaning liquid discharged from the brush 7 and the discharge flow rate R of the above-mentioned side rinse are changed in the case of scanning the brush 7 two times. In this case, the case is illustrated where the brush 7 moves on (cleans) the wafer 2 two times. A first wafer cleaning time T1a shows time required for cleaning the wafer 2 from the center of the wafer 2 up to about the half of the diameter of the wafer 2, and a second cleaning time T1b shows time required for cleaning the wafer 2 from about the half of the diameter of the wafer 2 up to the outer circumference of the wafer 2.

In this case, the wafer 2 is rotated at a relatively high speed in the first-time cleaning, and rotated at a relatively low speed in the second-time cleaning. Thereby, the discharged flow rate X of the cleaning liquid discharged from the brush 7 and the flow rate R of the side rinse are changed, too. However, the number of revolutions of the wafer is constant in respective cleaning steps.

In this case, the discharge flow rate X of the cleaning liquid discharged from the brush 7 is changed, for example, as follows. That is, the discharge flow rate X of the cleaning liquid is slowly increased in the first cleaning, and temporarily decreased when the first cleaning is changed to the second cleaning, and slowly increased again in the second cleaning. However, when the sequence reaches the shake-off drying time T2, the discharge flow rate X of the cleaning liquid is set to be zero (0) (that is, supply of the cleaning liquid is stopped). In this case, an initial flow rate of the cleaning liquid in the second cleaning is set to be a value higher than an initial flow rate of the cleaning liquid in the first cleaning. That is, the sequence is set so that a value of the discharge flow rate of the cleaning liquid discharged from the brush 7 is increased process in view of the general cleaning in which the first and second cleaning processes are combined.

Meanwhile, the discharge flow rate R of the side rinse is changed, for example, as follows. That is, the discharge flow rate R of the cleaning liquid is slowly decreased in the first cleaning, and temporarily increased when the first cleaning process is changed to the second cleaning process, and slowly decreased again in the second cleaning process, and moreover is set to be zero (0) (that is, supply of the cleaning liquid is stopped) when the sequence reaches the shake-off drying time T2. In this case, the initial flow rate of the cleaning liquid in the second cleaning process is set to be a value lower than the initial flow rate of the cleaning liquid in the first cleaning process. That is, the sequence is set so that a value of the discharge flow rate of the side rinse is decreased in view of the general cleaning process in which the first and second cleaning processes are combined.

In the above cleaning process, the brush cleaning time T1$a$ is, for example, about 15 seconds. The number of revolutions of the wafer 2 in the brush cleaning time T1$a$ is, for example, about 3,000 rpm. The brush cleaning time T1$b$ is, for example, about 15 seconds. The number of revolutions of the wafer 2 in the brush cleaning time T1$b$ is about 1,500 rpm. Moreover, description of the shake-off drying time T2 and the number of revolutions of the wafer 2 in the shake-off drying time T2 will be omitted because the shake-off drying time T2 and the number of revolutions of the wafer 2 therein are the same as those described for FIG. 10. Moreover, description of the diameter of the wafer 2 and the moving velocity of the brush 7 will be omitted because the diameter and the velocity are the same as those described for FIG. 10.

Figure 12:
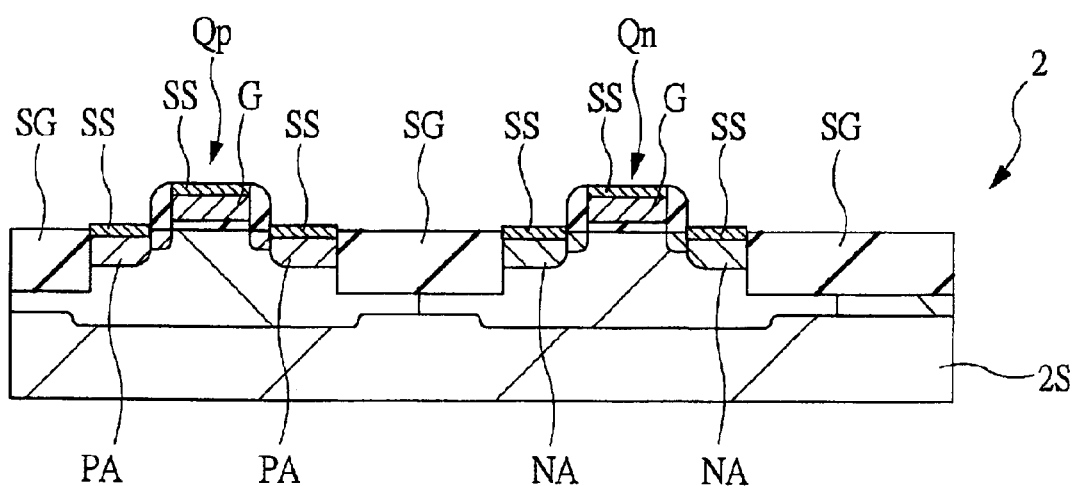
FIG. 12 is a cross-sectional view of a principal portion of a wafer in the manufacturing process of a semiconductor integrated circuit device that is an embodiment of the present invention.

FIG. 12 shows a cross-sectional view showing an example of a principal portion in a manufacturing process of a semiconductor integrated circuit device. A substrate 2S constituting a wafer 2 to be brush-cleaned is made of, for example, p-type single-crystal silicon (Si), and a pMIS Qp and an nMIS Qn constituting a CMIS (Complementary MIS) circuit are formed in active regions surrounded by groove-shaped separated portions SG on the main surface of the substrate 2S, respectively. This process shows a post-silicide process and a silicide layer SS made of, for example, tungsten silicide or the like is formed on a p-type semiconductor region PA for the source and drain of the pMIS Qp, an n-type semiconductor region NA for the source and drain of the nMIS Qn, and each gate electrode G. Because the tungsten silicide film is a hydrophobic film, the water film between the wafer 2 and the brush 7 becomes thin during a cleaning process, and the brush 7 contacts with the wafer 2 and foreign matters is transferred from the brush 7 to the wafer 2, and thereby damage may occur. However, to remove the foreign matters by the brush 7, it is necessary that the brush 7 sufficiently approaches the wafer 2 and the brush 7 contacts the foreign matter on the wafer 2. Therefore, in the cleaning process of such the hydrophobic film, it is particularly important to prevent a cleaning process while the interval between the brush 7 and the wafer 2 is kept properly, that is, while the interval between the brush 7 and the wafer 2 is kept constant, in order for the brush 7 and wafer 2 to have no contact and in order to obtain sufficiently the foreign-matter removal capacity. Therefore, it is advantageous to apply the technique of this embodiment to the cleaning process of the wafer 2 having a hydrophobic film.

Embodiment 2

Figure 13:
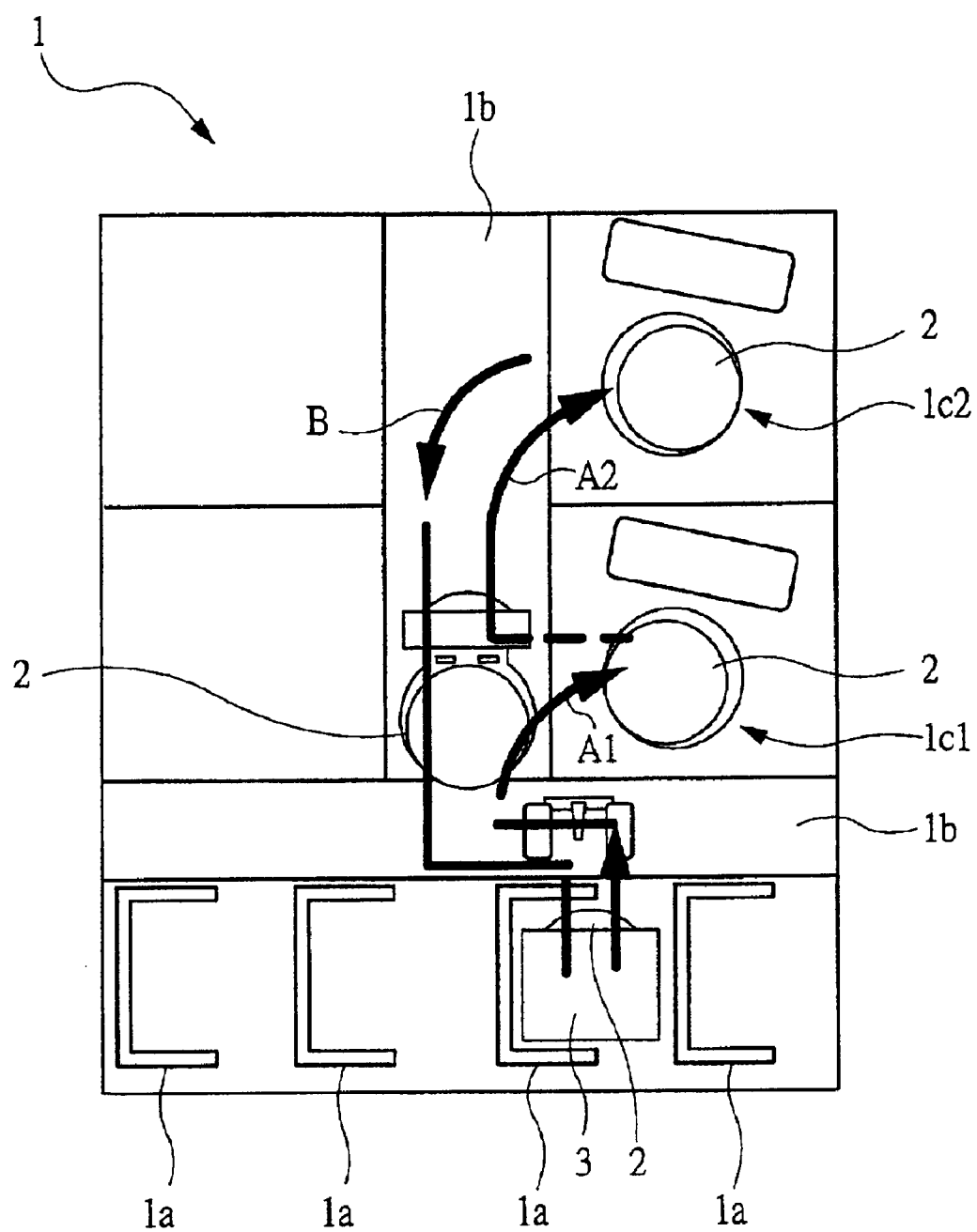
FIG. 13 is a plan view showing an example of a brush-cleaning equipment used in the manufacturing process of a semiconductor integrated circuit device that is another embodiment of the present invention.

FIG. 13 shows a plan view showing an example of a brush cleaning equipment 1 used in a manufacturing process of a semiconductor integrated circuit device, which is another embodiment of the present invention.

In this embodiment 2, the case is described in which a cleaning process of one wafer 2 is divided into, for example, two sub-cleaning steps, and the sub-cleaning steps are separately performed in cups 1$c$1 and 1$c$2, respectively. That is, one wafer 2 is taken out from a wafer cassette 3 accommodated in a loader 1$a$ and then carried into the cup 1$c$ through a carrying mechanism of a carrying path 1$b$ (arrow A1), and the first sub-cleaning step is performed. In this case, the wafer 2 is cleaned from the center of the wafer 2 up to about the half of the diameter of the wafer 2. Then, after the first sub-cleaning step in the cup 1$c$1 is completed, the wafer 2 is taken out from the cup 1$c$1 and accommodated in the adjacent cup 1$c$2 by the carrying mechanism of the carrying path 1$b$ (arrow A2), and then the second sub-cleaning step is performed. In this case, the wafer 2 is cleaned from the position of about the half of the diameter of the wafer 2 up to the circumference of the wafer 2.

Figure 14:
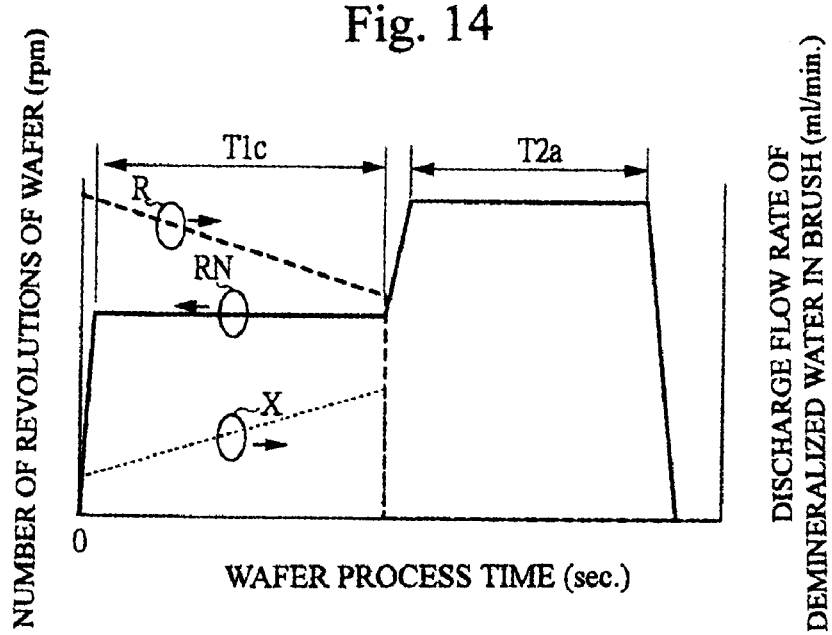
FIG. 14 is an illustration showing a sequence of a brush cleaning process in one cup of the brush-cleaning equipment in FIG. 13.
Figure 15:
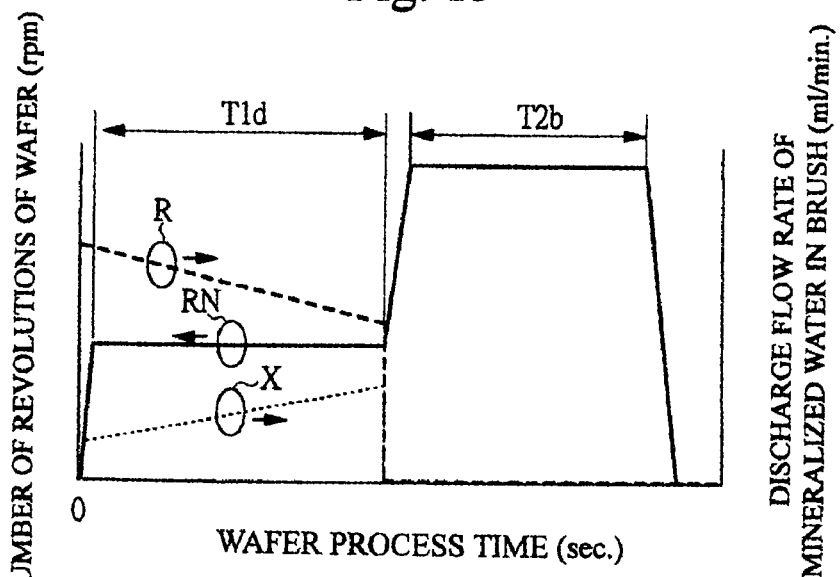
FIG. 15 is an illustration showing a sequence of a brush cleaning process in another cup of the brush-cleaning equipment in FIG. 13.

FIG. 14 shows an example of a first sub-cleaning sequence in the cup 1$c$1, and FIG. 15 show an example of a second sub-cleaning sequence in the cup 1$c$2.

The first brush sub-cleaning time T1$c$ in the cup 1$c$1 shown in FIG. 14 shows time required for cleaning the wafer 2 from the center of the wafer 2 up to about the half of the diameter of the wafer 2, and the second sub-cleaning time T1$d$ shown in the cup 1$c$2 in FIG. 15 shows time required for cleaning the wafer 2 from about the half of the diameter of the wafer 2 up to the outer circumference of the wafer 2.

Also in this case, the wafer 2 is rotated relatively at a high speed in the first sub-cleaning step and rotated relatively at a low speed in the second sub-cleaning step, similarly to the case of the brush cleaning sequence shown in FIG. 11 as described above. In accordance with these, the discharge flow rates of demineralized water 5 or the like discharged into the brush 7 is also changed. First, the discharge flow rate X of the cleaning liquid such as the demineralized water 5 or the like discharged from the brush 7 is slowly increased in the first brush sib-cleaning time T1$c$. Meanwhile, the discharge flow rate R of the side rinse is slowly decreased. When the sequence transfers to a shake-off drying time T2$a$, the discharge flow rate X of the cleaning liquid discharged from the brush 7 and the discharge flow rate R of the side rinse are set to be zero (0) (that is, supply of the cleaning liquid is stopped), respectively. After a drying process of the wafer 2, the wafer 2 is moved from the cup 1$c$1 to the cup 1$c$2 through the carrying path 1$b$ to start the second sub-cleaning step. Also in the second brush sub-cleaning time T1$d$, the discharge flow rate X of the cleaning liquid discharged from the brush 7 is slowly increased. However, increase in the discharge flow rate X in the second sub-cleaning step is moderated in comparison to increase in the discharge flow rate X in the first sub-cleaning step. Meanwhile, the discharge flow rate R of the side rinse is slowly decreased. In this case, the initial vale of the discharge flow rate R in the second sub-cleaning step is made lower than the initial value of the discharge flow rate R in the first sub-cleaning step and decrease in the discharge flow rate R in the second sub-cleaning step is moderated in comparison to decrease in the discharge flow rate R in the first sub-cleaning step. Moreover, when the sequence transfers to the shake-off drying time T2$b$, the discharge flow rate X of the cleaning liquid discharged from the brush 7 and the discharge flow rate R of the side rinse are returned to their initial flow rates, respectively.

The brush sub-cleaning time T1$c$ is, for example, about 30 seconds. The number of revolutions of the wafer 2 in the brush sub-cleaning time T1$a$ is, for example, about 3,000 rpm. Moreover, the brush sub-cleaning time T1$d$ is, for example, about 30 seconds. The number of revolutions of the wafer 2 in the brush sub-cleaning time T1$d$ is, for example, about 1,500 rpm. Because the shake-off drying time T2 and the number of revolutions of the wafer 2 (the number of revolutions of the wafer in each sub-cleaning steps is constant) in the time T2 are the same as those described for FIG. 10, their description will be omitted. Moreover, because the diameter of the wafer 2 and the moving velocity of the brush 7 are also the same as those described for FIG. 10, their description will be omitted.

Also in the case of this embodiment 2, it is possible to obtain the same advantage as the embodiment 1.

Embodiment 3

Figure 16:
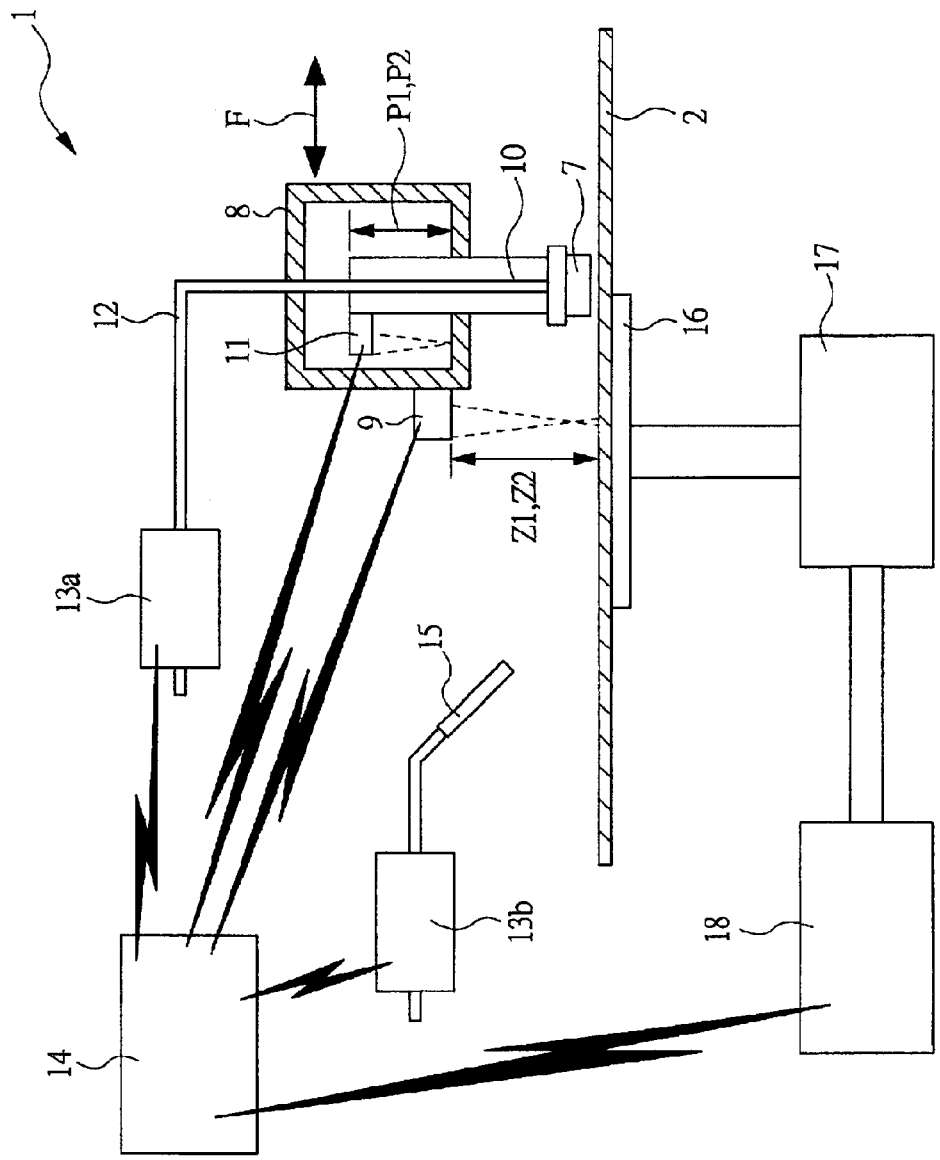
FIG. 16 is an explanatory view of a brush-cleaning equipment that is still another embodiment of the present invention.

FIG. 16 is an explanatory view of a brush cleaning equipment 1 that is still another embodiment of the present invention. A brush arm 8 of the brush cleaning equipment 1 has a structure capable of moving in the right and left directions of a wafer 2 (arrow F shows the horizontally moving direction of the brush). Moreover, the brush arm 8 has a distance-measuring device 9 capable of measuring the distance between the surface of the wafer 2 and a brush 7. The brush 7 is held by a brush shaft 10. A shaft-position reader 11 for reading the position of the brush shaft 10 is set to the brush shaft 10. Moreover, a demineralized-water pipe 12 for discharging demineralized water from the surface of the brush 7 is set to the brush shaft 10. The brush 7 and the demineralized-water pipe 12 are connected to each other by a shielding member such as a packing or the like so that cleaning liquid such as demineralized water or the like is discharged only from the surface of the brush 7. Moreover, the demineralized-water pipe 12 is connected to flow-rate regulators 13a and 13b so that the demineralized-water flow rate can be changed under brush cleaning process in accordance with a signal sent from a computing unit 14. Similarly, the demineralized-water-rinse nozzle 15 is connected to the flow-rate regulator 13b so that the demineralized-water flow rate can be changed under a brush cleaning process in accordance with a signal sent from the computing unit 14. The demineralized-water-rinse nozzle 15 corresponds to the above-mentioned side-rinse supply nozzle.

The wafer 2 is held by a wafer-holding chuck 16 so that it can be rotated by a driving means such as a motor 17 or the like. The number of revolutions of the motor 17 can be changed by a motor-rotation control section 18 in accordance with a signal sent from the computing unit 14. By using a reference wafer in advance, the distance up to the reference wafer at which a foreign-matter removal is optimized is measured by the distance-measuring device 9, and then is stored in the computing unit 14 as a reference distance. Moreover, at the same time, the positional relation between the reference wafer and the brush 7 is read by the shaft-position reader 11, and then is stored in the computing unit 14 as a brush reference position.

At star of a cleaning process, a measurement distance Z1 and a brush measurement position P1 at the central portion of the wafer 2 are measured by the distance-measuring device 9 and the shaft-position reader 11 while the brush 7 is lowered onto the cleaning face of the wafer 2, and thereby the difference between a reference distance Z2 and a brush reference position P2 is obtained by the computing unit 14. The difference between the reference distance Z2 caused by a warpage or the like of the wafer 2 and the measurement distance Z1 is added to the difference between the brush reference position P2 and the brush measurement position P1.

The number of revolutions of the wafer 2 for moving the brush 7 up to the brush reference position P2 set as an optimum cleaning condition, and the demineralized-wafer flow rates from the brush 7 and a demineralized-water-rinse nozzle 15 are computed by a computing program previously incorporated into the computing unit. The number of revolutions of the wafer and each demineralized-water flow rate obtained by the computing unit 14 are transferred to the motor-rotation control section 18, the flow-rate regulators 13a and 13b, and the wafer-holding chuck 16 to automatically regulate an upper and lower positions of the brush 7.

The brush 7 is moved from the center of the wafer 2 toward the outer circumference thereof. While the brush 7 is moved, the measurement distance Z1 and the brush measurement position P1 are measured and the foreign-matter removal capacity is uniformly obtained in the cleaning face of the optimum wafer 2.

Embodiment 4

Figure 17:
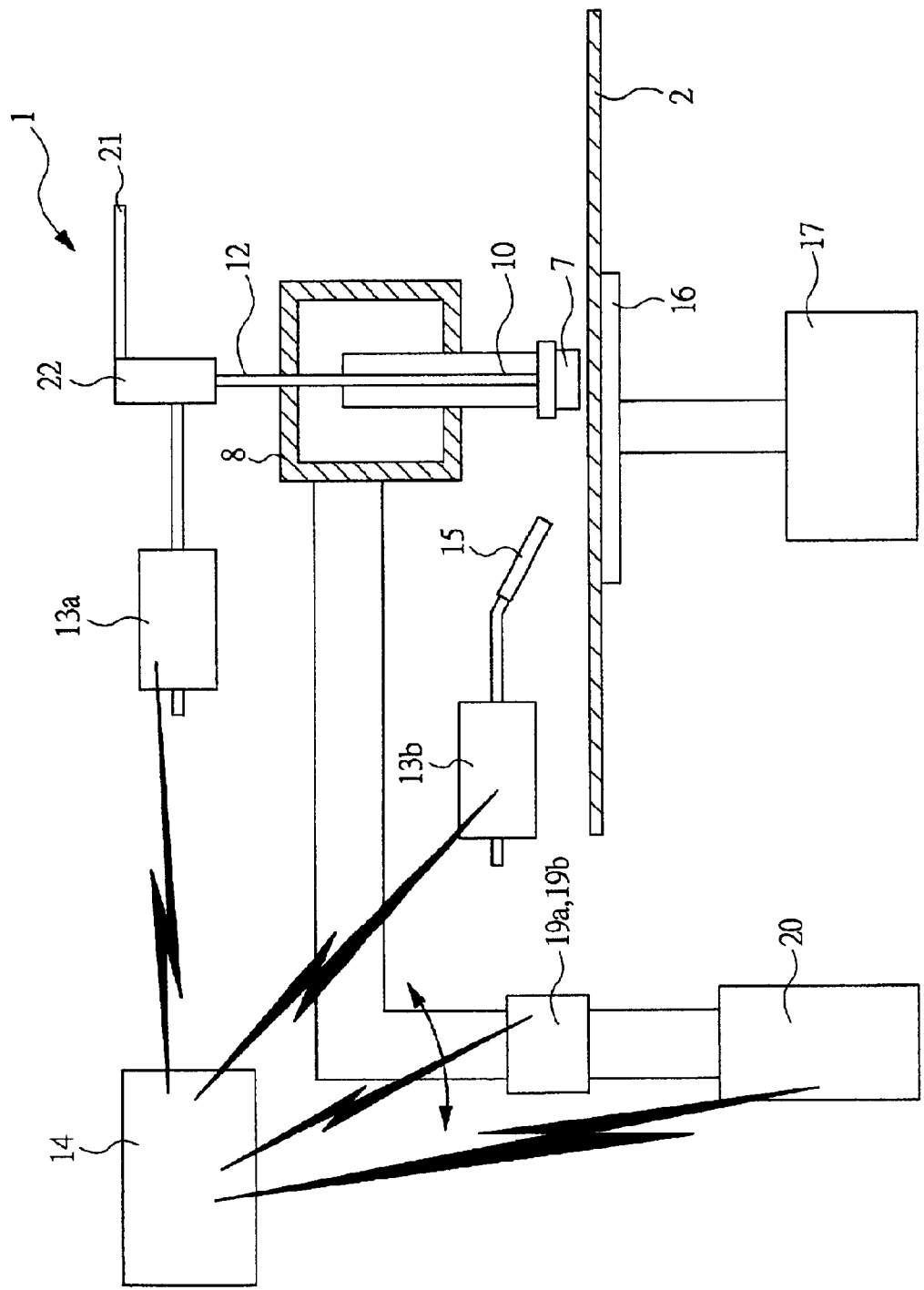
FIG. 17 is an explanatory view showing an example of a brush-cleaning equipment that is still another embodiment of the present invention.

FIG. 17 is an explanatory view showing an example of a brush cleaning equipment 1 of still another embodiment of the present invention.

A brush arm 8 is rotated by a brush-arm-rotation driving section 19a and a brush-arm-rotational-angle detecting section 19b, and provided with a mechanism capable of moving horizontally relative to the cleaning face of a wafer 2.

Moreover, the brush-arm-rotation driving section 19a and the brush-arm-rotational-angle detecting section 19b are further connected to a brush-arm vertically-driving section 20. By lowering the brush-arm vertically driving section 20, a brush 7 cleans the wafer 2.

The brush-arm-rotation driving section 19a, brush-arm-rotational-angle detecting section 19b, and brush-arm vertically driving section 20 are connected to a computing unit 14, and rotation and vertical driving of the brush arm 8 are controlled by the computing unit 14. The rotation driving of the brush arm 8 may be feedback-controlled by transmitting the data of the brush-arm-rotational-angle detecting section 19b to the computing unit 14.

The brush 7 is held by a brush shaft 10, and a demineralized-water pipe 12 for discharging cleaning liquid such as demineralized water or the like from the surface of the brush 7 is provided in the brush 7. The brush 7 and the demineralized-water pipe 12 are connected to each other by a shielding member such as a packing or the like so that the cleaning liquid such as demineralized water or the like is discharged only from the surface of the brush 7.

The demineralized-water pipe 12 is connected to a flow-rate regulator 13a so that demineralized-water flow rates can be changed during a brush cleaning process in accordance with a signal sent from a computing unit 14. Similarly, a demineralized-water-rinse nozzle 15 is also connected to a flow-rate regulator 13b so that demineralized-water flow rates can be changed during a brush cleaning process in accordance with a signal sent from the computing unit 14.

Flow rates of the demineralized water flowing into the flow rate regulators 13a and 13b are previously stored when the brush 7 contacts the wafer 2 and the portion nearby the center of the wafer 2 is cleaned and the circumference of the wafer 2 is cleaned in accordance with signals sent from the computing unit 14.

After start of a cleaning sequence, the flow-rate regulators 13a and 13b regulate flow rates of the demineralized water flowing through the brush 7 and the demineralized-water-rinse nozzle 15 in accordance with a program previously stored in the computing unit 14 correspondingly to the upper or lower position or the right or left position of the brush arm 8 and the number of revolutions of the wafer 2.

Also when the brush 7 moves from the center of the wafer 2 toward the outer circumference thereof, a demineralized-water flow rate is regulated correspondingly to the upper or lower position or the right or left position of the brush arm 8 and the number of revolutions of the wafer 2. In this case, the discharge flow rate of demineralized water discharged from the brush 7 is slowly increased as the brush 7 moves from the center of the wafer 2 toward the outer circumference thereof similarly to the case of description of the above-mentioned embodiment 1. Moreover, the flow rate of demineralized water discharged from the demineralizedwater-rinse nozzle 15 is slowly decreased. Thereby, even while the brush 7 moves, the interval between the brush 7 and the wafer 2 can be kept constant and the thickness of a water film can be kept constant during movement of the brush 7. Therefore, the foreign-matter removal capacity is uniformly obtained in the cleaning face of the wafer 2. Symbol 21 in FIG. 17 denotes a brush-cleaning pipe, and symbol 22 denotes a switching mechanism of the demineralized water and the brush-cleaning liquid.

Embodiment 5

Figure 18:
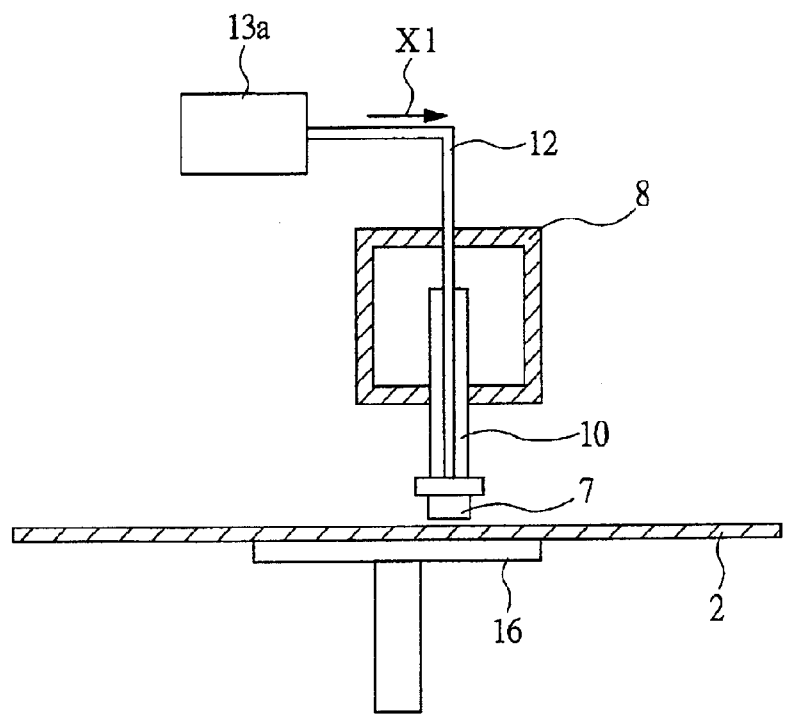
FIG. 18 is an explanatory view showing an example of a principal portion of a brush-cleaning equipment that is still another embodiment of the present invention.
Figure 19:
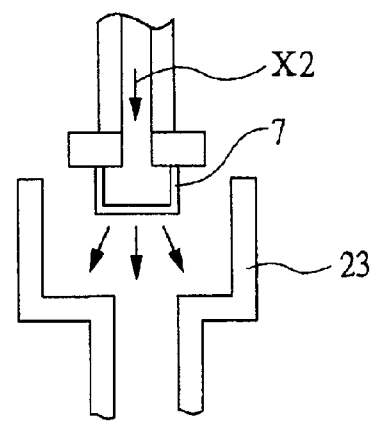
FIG. 19 is an explanatory view of a brush-waiting section of the brush-cleaning equipment in FIG. 15.

FIG. 18 is an explanatory view showing an example of a principal portion of a brush-cleaning equipment 1 that is still another embodiment of the present invention, and FIG. 19 is a cross-sectional view of a principal portion of the brush-waiting section in the brush-cleaning equipment in FIG. 18.

A wafer-holding chuck 16 and a wafer 2 are rotated while a wafer is held 2 by a wafer-holding chuck 16. Demineralized-water flow rate X1 is supplied to a mechanism mounting a brush 7, a demineralized-water pipe 12, a brush arm 8, a brush shaft 10, and a flow-rate regulator 13a. This demineralized water comes to such a state as to ooze from the front end of the brush 7. Under the above state, a brushing mechanism drops onto the wafer 2 to scan the surface of the wafer 2. Then, the mechanism mounting the brush 7, demineralized-water pipe 12, brush arm 8, brush shaft 10, and flow-rate regulator 13a moves to a brush-waiting section 23 serving as a cup different from a cleaning cup. When the mechanism returns to the brush-waiting section 23, increase in a demineralized-water flow rate is instructed by the flow-rate regulator 13a. A demineralized-water flow rate X2 in the demineralized-water pipe 12 increases in comparison to the case of brush scrubbing (demineralized-water flow rate X2>demineralized-water flow rate X1). Thereby, it is possible to wash off foreign matters adhering to the brush 7 when the wafer 2 is cleaned. As a result, it is possible to reduce or prevent transfer of the foreign matters, which adhere to the brush 7, to the wafer 2 in cleaning of the wafer 2. Accordingly, it is possible to improve the yield and reliability of semiconductor integrated circuit devices.

Embodiment 6

Figure 20:
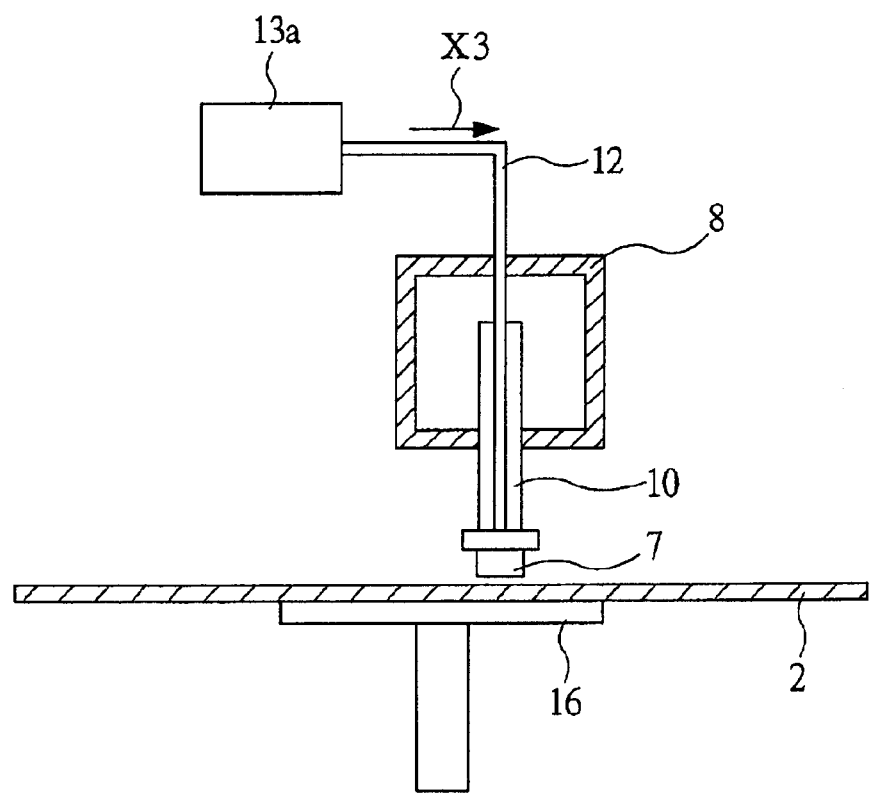
FIG. 20 is an explanatory view showing an example of a principal portion of a brush-cleaning equipment that is still another embodiment of the present invention.
Figure 21:
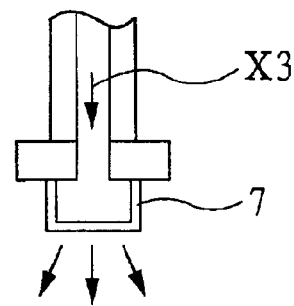
FIG. 21 is an explanatory view of a brush-waiting section of the brush-cleaning equipment in FIG. 20.

FIG. 20 is an explanatory view showing an example of a principal portion of a brush-cleaning equipment 1 that is still another embodiment of the present invention, and FIG. 21 is a cross-sectional view of a principal portion of a brush-waiting section.

While a wafer 2 is held by a wafer-holding chuck 16 and the wafer-holding chuck 16 and the wafer 2 are rotated, functional water is made to flow into a mechanism mounting a brush 7, a demineralized-water pipe 12, a brush arm 8, a brush shaft 10, and a flow-rate regulator 13a at a flow rate X3. This functional water is made of, for example, water or the like in which ozone is dissolved, and has a function capable of removing foreign matters from the wafer 2 and preventing the foreign matters from re-adhering to the wafer 2. The functional water comes to such a state as to ooze from the front end of the brush 7. Under the above state, a brushing mechanism drops onto the wafer to scan the surface of the wafer 2. In the case of demineralized water, there is a high possibility that foreign matters will adhere to the brush 7 itself from the wafer 2 during scanning. In the case of functional water, however, adhesion of the foreign matters to the brush 7 is difficult because the functional water is alkaline. Therefore, it is possible to reduce or eliminate the adhesion of the foreign matters to the brush 7 and thereby keep the cleanliness of the brush 7 itself.

Moreover, because the functional water creates an environment in which re-adhesion of the foreign matters on the wafer 2 is difficult, it is also possible to improve the foreign-matter removal capacity on the wafer 2.

Embodiment 7

Figure 22:
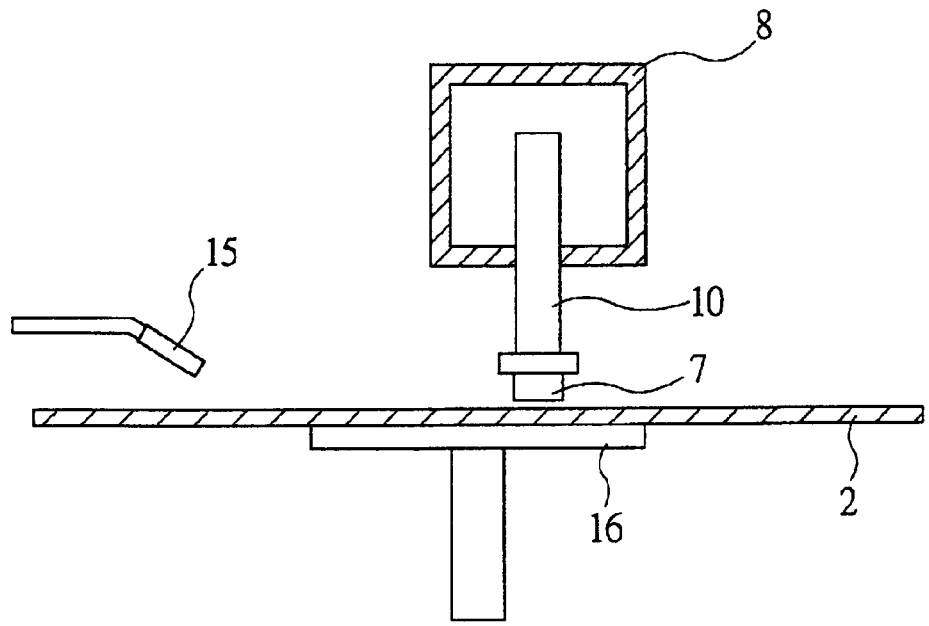
FIG. 22 is an explanatory view showing an example of a principal portion of a brush-cleaning equipment which is still another embodiment of the present invention.
Figure 23:
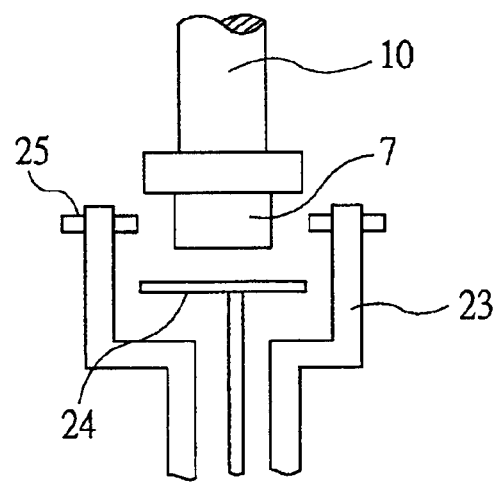
FIG. 23 is an explanatory view of a brush-waiting section of the brush-cleaning equipment in FIG. 22.

FIG. 22 is an explanatory view showing an example of a principal portion of a brush-cleaning equipment 1 that is still another embodiment of the present invention, and FIG. 23 is a cross-sectional view showing a brush-waiting section of the brush-cleaning equipment 1 in FIG. 22.

While the wafer 2 is held by a wafer-holding chuck 16 and the wafer-holding chuck 16 and wafer 2 are rotated, demineralized water is discharged from a demineralized-water-rinse nozzle 15 onto a wafer 2. A mechanism mounting a brush 7, a brush arm 8, and a brush shaft 10 drops onto the wafer 2. After the mechanism drops, it scans the wafer 2 toward the outer circumference of the wafer 2. After scanning of the wafer 2, foreign matters on the wafer 2 may adhere to the brush 7. Thereupon, the mechanism mounting a brush 7, a brush arm 8, and a brush shaft 10 is moved to a brush-waiting section 23 to bring the brush 7 into contact with a removal member 24 and rotate the brush 7 or the removal member 24. Moreover, the removal member 24 is vertically vibrated. Under this state, foreign matters adhering to the brush 7 is removed by discharging the above-mentioned functional water from a functional-water discharge nozzle 25. Thereby, it is possible to improve the removal capacity of the foreign matters adhering to the brush 7 and thus suppress or prevent re-adhesion of the foreign matters to the wafer 2 from the brush 7. The illustrated removal member 24 is a flat type, and is not restricted to the flat type, and can be modified variously. For example, the removal member may be constituted by a plurality of flexible bars or the like.

As described above, the present invention made by the present inventors has been specifically described in accordance with the embodiments. However, the present invention is not restricted to the above embodiments, and, needless to say, can be variously modified without departing from the gist thereof.

For example, the present invention can be applied to a manufacturing method of a semiconductor integrated circuit device, which uses a so-called SOI (Silicon On Insulator) substrate constituted by, for example, forming a device-forming semiconductor layer on an insulating layer.

Moreover, the above embodiments 1 to 7 exemplify the case of a cleaning process after deposition of a tungsten silicide film as a hydrophobic film. However, the present invention is not restricted to the above case, and can be applied variously. For example, the present invention can be also applied to a cleaning process after deposition of a film such as a titanium film (TiN) or the like.

Furthermore, in the two sub-cleaning steps in FIGS. 11, 14, and 15, the case is described in which flow rates of cleaning liquid discharged from a brush and side rinse are slowly increased or decreased in the first sub-cleaning step and the second sub-cleaning step. However, the present invention is not restricted to the above case and, for example, may keep the discharge flow rate of cleaning liquid constant. In this case, however, discharge flow rates of cleaning liquid discharged from the brush and side rinse are made different from each other in the first and second sub-cleaning steps. That is, the discharge flow rate of the cleaning liquid discharged from the brush is set to be a first value in the first sub-cleaning step and set to be a larger second value in the second sub-cleaning step than the first value. Moreover, the discharge flow rate of the side rinse is set to be a third value in the first sub-cleaning step, and set to be a smaller fourth value in the second sub-cleaning step than the third value.

In the above description, the case is mainly described in which the invention chiefly made by the present inventor is applied to a manufacturing method of a semiconductor integrated circuit device having a CMIS circuit, which is the utilization field serving as the background of the invention. However, the present invention is not restricted to the above method. For example, the present invention can be applied to a manufacturing method of an integrated circuit device having a memory circuit such as a DRAM (Dynamic Random Access Memory), SRAM (Static Random Access Memory), flash memory (EEPROM: Electric Erasable Programmable Read Only Memory) or the like, and a manufacturing method of a semiconductor integrated circuit device having a logic circuit such as a microprocessor or the like, and a manufacturing method of a mixed semiconductor integrated circuit device in which the above memory circuit and logic circuit are provided over the same substrate. Moreover, the present invention can be applied to a manufacturing method of a liquid-crystal substrate and a manufacturing method of a micromachine.

Advantages obtained from a typical invention among inventions disclosed in this application will be briefly described below.

(1) When a wafer is cleaned by a cleaning process using a brush, it is possible to improve a foreign-matter removal capacity of the cleaning process so that the interval between the wafer and the brush can be kept constant by regulating the cleaning condition based on a cleaning state.

(2) When a wafer is cleaned by a cleaning process using a brush, it is possible to reduce or prevent damage to the wafer so that the interval between the wafer and the brush can be kept constant by regulating the cleaning condition based on a cleaning state.

What is claimed is:

1. In a process of manufacturing a semiconductor integrated circuit device, a method of cleaning a semiconductor wafer comprising, a step of performing a cleaning process using a brush and wafer rotating relative to one another and thereby cleaning said wafer, wherein at least one of a first quantity of cleaning liquid flowing into said brush and a second quantity of cleaning liquid supplied to the wafer from outside of said brush is regulated in accordance with a cleaning state of said wafer, and wherein at least one of said first quantity of said cleaning liquid and said second quantity of said cleaning liquid is regulated so that an interval between said brush and said wafer is kept constant.

2. In a process of manufacturing a semiconductor integrated circuit device, a method of cleaning a semiconductor wafer comprising a step of performing a cleaning process using a brush rotating relative to one another and wafer and thereby cleaning said wafer, wherein at least one of a first quantity of cleaning liquid flowing into said brush and a second quantity of cleaning liquid supplied to said wafer from the outside of said brush is regulated in accordance with a cleaning state of said wafer wherein an interval between said wafer and said brush is measured, and wherein a number of revolutions per minute of said wafer and at least one of said first quantity of said cleaning liquid and said second quantity of said cleaning liquid is regulated in accordance with a result of said measurement.

3. In a process of manufacturing a semiconductor integrated circuit device, a method of cleaning a semiconductor wafer comprising a step of performing a cleaning process using a brush rotating relative to one another and wafer and thereby cleaning said wafer, wherein at least one of a first quantity of cleaning liquid flowing into said brush and a second quantity of cleaning liquid supplied to said wafer from the outside of said brush is regulated in accordance with a cleaning state of said wafer wherein at least one of said first quantity of said cleaning liquid and said second quantity of said cleaning liquid is regulated in accordance with a position of said brush on said wafer.

4. In a process of manufacturing a semiconductor integrated circuit device, a method of cleaning a semiconductor wafer comprising a step of performing a cleaning process using a brush rotating relative to one another and wafer and thereby cleaning said wafer, wherein at least one of a first quantity of cleaning liquid flowing into said brush and a second quantity of cleaning liquid supplied to said wafer from the outside of said brush is regulated in accordance with a cleaning state of said wafer wherein said cleaning is performed while said brush is moved from the center of said wafer toward the outer circumference thereof, and the first quantity of the cleaning liquid flowing into said brush is regulated so as to be slowly increased as said brush is moved from the center of said wafer toward the circumference thereof.

5. The manufacturing process of a semiconductor integrated circuit device according to claim 4, wherein the second quantity of the cleaning liquid supplied from the outside of said brush to the wafer is regulated so as to be slowly decreased as said brush is moved from the center of said wafer toward the outer circumference thereof.

6. In a process of manufacturing a semiconductor integrated circuit device, a method of cleaning a semiconductor wafer comprising a step of performing a cleaning process using a brush rotating relative to one another and wafer and thereby cleaning said wafer, wherein at least one of a first quantity of cleaning liquid flowing into said brush and a second quantity of cleaning liquid supplied to said wafer from the outside of said brush is regulated in accordance with a cleaning state of said wafer wherein said cleaning is performed while said brush is moved from the center of said wafer toward the outer circumference thereof, said outer circumference of said wafer having a peripheral velocity greater than a peripheral velocity of said center of said wafer, whereby said peripheral velocity increases from said center of said wafer toward said periphery of said wafer, and the first quantity of cleaning liquid flowing into said brush is regulated so as to be slowly increased in accordance with said increase in the peripheral velocity of said wafer.

7. The manufacturing process of a semiconductor integrated circuit device according to claim 6, wherein the second quantity of the cleaning liquid supplied from the outside of said brush to the wafer is regulated so as to be slowly decreased in accordance with said increase in the peripheral velocity of said wafer.

8. In a process of manufacturing a semiconductor integrated circuit device, a method of cleaning a semiconductor wafer comprising a step of performing a cleaning process using a brush rotating relative to one another and wafer and thereby cleaning said wafer, wherein at least one of a first quantity of cleaning liquid flowing into said brush and a second quantity of cleaning liquid supplied to said wafer from the outside of said brush is regulated in accordance with a cleaning state of said wafer, wherein said cleaning is performed while said brush is moved from the center of said wafer toward the outer circumference thereof, and the second quantity of cleaning liquid supplied from the outside of said brush to the wafer is regulated so as to be slowly decreased as said brush is moved from the center of said wafer toward the outer circumference thereof.

9. In a process of manufacturing a semiconductor integrated circuit device, a method of cleaning a semiconductor wafer comprising a step of performing a cleaning process using a brush rotating relative to one another and wafer and thereby cleaning said wafer, wherein at least one of a first quantity of cleaning liquid flowing into said brush and a second quantity of cleaning liquid supplied to said wafer from the outside of said brush is regulated in accordance with a cleaning state of said wafer, wherein said cleaning is performed while said brush is moved from the center of said wafer toward the outer circumference thereof, said outer circumference of said wafer having a peripheral velocity greater than a peripheral velocity of said center of said wafer, whereby said peripheral velocity increases from said center of said wafer toward said periphery of said wafer, and the second quantity of cleaning liquid supplied from the outside of said brush to the wafer is regulated so as to be slowly decreased in accordance with said increase in the peripheral velocity of said wafer.

10. In a process of manufacturing a semiconductor integrated circuit device, a method of cleaning a semiconductor wafer comprising a step of performing a cleaning process using a brush and wafer rotating relative to one another and thereby cleaning said wafer, wherein at least one of a first quantity of cleaning liquid flowing into said brush and a second quantity of cleaning liquid supplied to said wafer from the outside of said brush is regulated in accordance with a cleaning state of said wafer, wherein, after said wafer is cleaned, said brush returns to a wait section, and demineralized water is discharged from the brush at a flow rate that is greater than said flow rate before said brush returns to said wait section.

11. In a process of manufacturing a semiconductor integrated circuit device, a method of cleaning a semiconductor wafer comprising a step of performing a cleaning process using a brush and wafer rotating relative to one another and thereby cleaning said wafer, wherein at least one of a first quantity of cleaning liquid flowing into said brush and a second quantity of cleaning liquid supplied to said wafer from the outside of said brush is regulated in accordance with a cleaning state of said wafer, wherein, after said wafer is cleaned, said brush returns to a wait section, and said brush itself is cleaned while said brush is brought into contact with a removal member and brush-cleaning water is supplied to a contact portion thereof.

12. In a process of manufacturing a semiconductor integrated circuit device, a method of cleaning a semiconductor wafer comprising a step of performing a cleaning process using a brush and wafer rotating relative to one another and thereby cleaning said wafer, wherein at least one of a first quantity of cleaning liquid flowing into said brush and a second quantity of cleaning liquid supplied to said wafer from the outside of said brush is regulated in accordance with a cleaning state of said wafer, wherein water having a function of removal of and prevention against foreign matter is discharged into said brush.

13. In a process for manufacturing a semiconductor integrated circuit device, a method of cleaning a semiconductor wafer comprising a step of performing a cleaning process using a brush and wafer rotating relative to one another and thereby cleaning said wafer, wherein said cleaning process is regulated in accordance with a cleaning state of said wafer so that an interval between the wafer and the brush is kept at a constant value.

14. The method of cleaning a semiconductor wafer according to claim 13, wherein a quantity of cleaning liquid is supplied to said semiconductor wafer, and the interval between said wafer and said brush is measured, and the numbers of revolutions per minute of said wafer and said quantity of cleaning liquid are regulated in accordance with a result of said measurement.

15. The method of cleaning a semiconductor wafer according to claim 13, wherein a quantity of cleaning liquid is supplied to said semiconductor wafer, and wherein said quantity of said cleaning liquid is regulated in accordance with a position of said brush on said wafer.

16. The method of cleaning a semiconductor wafer according to claim 13, wherein said cleaning is performed while said brush is moved from the center of said wafer toward the circumference thereof, and a first quantity of cleaning liquid is supplied from said brush and is regulated so as to be slowly increased as said brush is moved from the center of said wafer toward the outer circumference thereof.

17. The method of cleaning a according to claim 13, wherein said cleaning is preformed while said brush is moved from the center of said wafer toward the outer circumference thereof, said outer circumference of said wafer having a peripheral velocity greater than a peripheral velocity of said center of said wafer whereby said peripheral velocity increases from said center of said wafer toward said periphery of said wafer, and a quantity of cleaning liquid is supplied to said brush and is regulated so as to be slowly increased in accordance with said increase in the peripheral velocity of said wafer.

18. The method of cleaning a semiconductor wafer according to claim 13, wherein said cleaning is performed while said brush is moved from the center of said wafer toward the outer circumference thereof, and a quantity of cleaning liquid is supplied from the outside of said brush to said wafer and is regulated so as to be slowly decreased as said brush is moved from the center of said wafer toward the outer circumference thereof.

19. The method of cleaning a semiconductor wafer according to claim 13, wherein said cleaning is performed while said brush is moved from the center of said wafer toward the outer circumference thereof, said outer circumference of said wafer having a peripheral velocity greater than a peripheral velocity of said center of said wafer whereby said peripheral velocity increases from said center of said wafer toward said periphery of said wafer, and a quantity of cleaning liquid is supplied from the outside of said brush to said wafer and said quantity of cleaning liquid is regulated so as to be slowly decreased in accordance with increase in the peripheral velocity of said wafer.

20. The method of cleaning a semiconductor wafer according to claim 13, wherein said cleaning is performed while said brush is moved from the center of said wafer toward the outer circumference thereof, and a first quantity of cleaning liquid is supplied into said brush and is regulated so as to be slowly increased and a second quantity of cleaning liquid is supplied from the outside of said brush to said wafer and is regulated so as to be slowly decreased, as said brush is moved from the center of said wafer to the outer circumference thereof.

21. The method of cleaning a semiconductor wafer according to claim 13, wherein said cleaning is performed while said brush is moved from the center of said wafer toward the outer circumference thereof, said outer circumference of said wafer having a peripheral velocity greater than a peripheral velocity of said center of said wafer whereby said peripheral velocity increases from said center of said wafer toward said periphery of said wafer, and a first quantity of cleaning liquid is supplied into said brush is regulated so as to be slowly increased and a second quantity of cleaning liquid is supplied from the outside of said brush to said wafer and is regulated so as to be slowly decreased, in accordance with said increase in the peripheral velocity of said wafer.

22. The method of cleaning a semiconductor wafer according to claim 13, wherein after the wafer is cleaned, said brush returns to a wait section, and demineralized water is discharged from said brush.

23. The method of cleaning a semiconductor wafer according to claim 13, wherein after the wafer is cleaned, said brush returns to a wait section, and said brush itself is cleaned by being brought into contact with a removal member and brush-cleaning water is supplied to a contact portion thereof.

24. The method of cleaning a semiconductor wafer according to claim 13, wherein water having a function of removal of foreign matter and prevention against re-adhesion of foreign matter is supplied into said brush.

25. In a process for manufacturing a semiconductor integrated circuit device, a method of cleaning a semiconductor wafer comprising a step of performing a cleaning process using a brush and wafer rotating relative to one another and thereby cleaning said wafer, wherein said cleaning process is divided into a plurality of sub-cleaning steps, and wherein at least one of a first quantity of cleaning liquid flowing into said brush and a second quantity of cleaning liquid supplied from the outside of said brush is altered in accordance with each of said plurality of sub-cleaning steps.

26. The method of cleaning a semiconductor wafer according to claim 25, wherein said plurality of sub-cleaning steps are executed in a single process chamber.

27. The method of cleaning a semiconductor wafer according to claim 25, wherein said plurality of sub-cleaning steps are executed in separate cleaning chambers.

28. The method of cleaning a semiconductor wafer according to claim 25, wherein said first quantity of the cleaning liquid flowing into said brush is kept constant in each of said plurality of sub-cleaning steps, and wherein said first quantity of cleaning liquid is greater in a sub-cleaning step wherein a peripheral region of said wafer is being cleaned than in a sub-cleaning step in which a central region of said wafer is being cleaned.

29. The method of cleaning a semiconductor wafer according to claim 25, wherein the second quantity of the cleaning liquid supplied from the outside of said brush to the wafer is kept constant in each of said plurality of sub-cleaning steps, and wherein said second quantity of cleaning liquid is less in a sub-cleaning step wherein a peripheral region of the wafer is being cleaned than in a sub-cleaning step in which a central region of the wafer is being cleaned.

30. The method of cleaning a semiconductor wafer according to claim 25, wherein the first quantity of the cleaning liquid flowing into said brush is regulated so as to slowly increase in each of said plurality of sub-cleaning steps.

31. The method of cleaning a semiconductor wafer according to claim 25, wherein the second quantity of the cleaning liquid supplied from the outside of said brush to the wafer is regulated so as to slowly decrease in each of said plurality of sub-cleaning steps.

* * * * *